United States Patent [19]
Miyajima et al.

[11] Patent Number: 5,981,980
[45] Date of Patent: Nov. 9, 1999

[54] SEMICONDUCTOR LAMINATING STRUCTURE

[75] Inventors: Takao Miyajima; Yann Le Bellego; Hiroji Kawai, all of Kanagawa, Japan

[73] Assignee: Sony Corporation, Tokyo, Japan

[21] Appl. No.: 08/839,903

[22] Filed: Apr. 18, 1997

[30] Foreign Application Priority Data

Apr. 22, 1996 [JP] Japan .................................. 8-100350

[51] Int. Cl.$^6$ .................................................. H01L 33/00
[52] U.S. Cl. ............................ 257/103; 257/94; 257/194; 257/280; 257/627
[58] Field of Search ................................ 257/94, 96, 103, 257/194, 280, 615, 627

[56] References Cited

U.S. PATENT DOCUMENTS 5,716,450  2/1998  Togawa et al. ...................... 117/101

*Primary Examiner*—Minh Loan Tran
*Attorney, Agent, or Firm*—Hill & Simpson

[57] ABSTRACT

To provide a semiconductor laminating structure in which an epitaxial growth of a GaN system material is achieved on a substrate with an excellent matching property with the substrate. The semiconductor laminating structure includes the substrate having a perovskite structure and at least one GaN system chemical compound semiconductor layer formed on the substrate, wherein a major surface of the substrate is formed of a (111) crystal surface.

6 Claims, 10 Drawing Sheets

SEMICONDUCTOR LAMINATING STRUCTURE

BACKGROUND

1. Field of the Invention

The present invention relates to a semiconductor laminating structure suitable for use with a semiconductor light emitting device or the like, for example. More specifically, the present invention relates to a semiconductor light emitting device, a field-effect transistor or the like having a semiconductor laminating structure which includes a semiconductor layer made of a GaN system chemical compound containing elements of N and at least one of Al, B, Ga and In.

2. Background of the Invention

A GaN system III–V family crystal allows its band gap energy to be changed in a range of 1.95 eV to 6.2 eV depending on its composition. Thus, the crystal draws an attention as a luminescent material capable of emitting light having each wavelengths over a wide range from red to ultraviolet.

Particularly, since a light emission diode LED of a high luminance using a material of GaN is recently realized, research over such a light emission diode LED has been done prosperously.

At present, as a substrate for growing thereon a GaN system material, a sapphire crystal ($\alpha$-$Al_2O_3$) is generally and widely utilized. However, there is such a large lattice mismatch as 16.1% between a GaN crystal and the sapphire crystal. Further, both of them have thermal expansion coefficients different from each other. Therefore, the sapphire crystal is not necessarily best suited substrate. The large lattice mismatch causes increase in dislocation density and a non-radiative center in the GaN crystal grown on the substrate and decrease in life of radiation recombination. Thus, the lattice mismatch may cause considerable influence on characteristics of various elements such as a laser diode, in particular, which requires current injection at high energy and so on.

In consequence, a 6H-SiC substrate, a Si substrate, a GaAs substrate, a ZnO substrate, a MgO substrate, a $MgAl_2O_4$ substrate and so on are discussed as a substrate capable of replacing for the sapphire substrate which has been utilized for laminating thereon a semiconductor laminating structure made of a GaN system III–V family chemical compound. However, each of the materials has an advantage and a disadvantage in a state of crystal, and there has been proposed no excellent substrate yet that can replace for the sapphire substrate.

OBJECTS AND SUMMARY OF THE INVENTION

Therefore, it is a general object of the present invention to provide a semiconductor laminating structure by which the aforesaid shortcomings and disadvantages encountered with the prior art can be eliminated.

More specifically, it is an object of the present invention to provide a semiconductor laminating structure on which GaN system materials, particularly GaN can be satisfactorily grown in an epitaxial fashion with an excellent matching property.

It is another object of the present invention to provide a semiconductor light emitting device employing the semiconductor laminating structure which enables the GaN system materials, particularly GaN, to be satisfactorily grown in an epitaxial fashion with an excellent matching property.

It is still another object of the present invention to provide a field-effect transistor employing the semiconductor laminating structure which enables the GaN system materials, particularly GaN, to be satisfactorily grown in an epitaxial fashion with an excellent matching property.

According to a first aspect of the present invention, there is provided a semiconductor laminating structure including a substrate having a perovskite-type structure and at least one semiconductor layer which is formed on the substrate and made of a chemical compound containing elements of N and at least one of Al, B, Ga and In, wherein the major surface of the substrate is made to be a crystal face of (111), (110) or (001).

Further, according to a second aspect of the present invention, there is provided a semiconductor light emitting device including at least one semiconductor layer made of a chemical compound containing elements of N and at least one of Al, B, Ga and In, wherein the semiconductor light emitting device is formed on a substrate composed of an yttrium·aluminum·perovskite.

Furthermore, according to a third aspect of the present invention, there is provided a field-effect transistor including at least one semiconductor layer made of a chemical compound containing elements of N and at least one of Al, B, Ga and In, wherein the field-effect transistor is formed on a substrate composed of an yttrium·aluminum·perovskite.

According to the semiconductor laminating structure and the semiconductor light emitting device and the field-effect transistor employing the above structure, it is possible to grow a target semiconductor layer of a GaN system III–V family directly on the substrate in an epitaxial fashion so as to satisfactorily match with the substrate. Therefore, the crystal of the GaN system semiconductor layer epitaxially grown on the substrate is high in quality and very little in crystal defect. Accordingly, it is possible to provide various kinds of semiconductor devices such as a semiconductor light emitting device and so on which have an excellent property in light emission characteristic, for example.

The above and other objects, features, and advantages of the present invention will become apparent from the following detailed description of an illustrative embodiment thereof to be read in conjunction with the accompanying drawings, in which like reference numerals are used to identify the same or similar parts in the several views.

DETAILED DESCRIPTION OF THE PREFERRED EMBODIMENT

An embodiment of the semiconductor laminating structure according to the present invention will be described.

The semiconductor laminating structure according to the present invention includes a substrate having a perovskite-type structure, particularly, a crystal substrate of a perovskite-type structure made of an yttrium·aluminum·perovskite (YAP), e.g., YAlO$_3$, and a semiconductor layer of a GaN system III–V family chemical compound grown on the crystal substrate in an epitaxial fashion.

When the semiconductor of the GaN system III–V family chemical compound is directly grown in an epitaxial fashion on the YAlO$_3$ crystal substrate having the perovskite-type structure, the semiconductor thus made generally has a hexagonal crystal structure of which c axis is perpendicular to the substrate.

A semiconductor layer made of a GaN system crystal such as a GaN crystal, an InGaN crystal, an AlGaN crystal or the like can be positively and very satisfactorily grown on, particularly, a (111) YAlO$_3$ crystal substrate.

Figure 4:
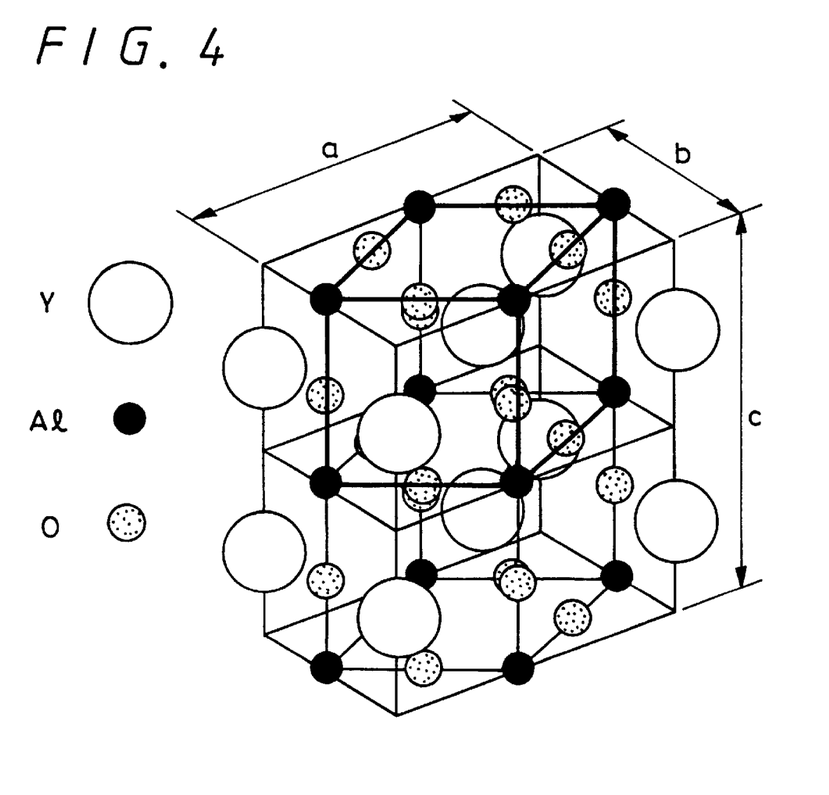
FIG. 4 is a diagram showing a structure of a $YAlO_3$ crystal.

The YAlO$_3$ crystal is one of composite oxides represented by LnAlO$_3$ (here, Ln represents a rare earth element) and it is produced by combining a rare earth material with aluminum at ratio of 1:1. This crystal has a perovskite-type crystal structure as shown in FIG. 4 (an orthorhombic crystal structure with lattice constants, a=5.18 Å, b=5.33 Å, c=7.37 Å), and it has the following several characteristics beneficial as a substrate on which a semiconductor of the GaN system III–V family chemical compound is grown in an epitaxial fashion.

That is, the YAlO$_3$ crystal has the following characteristics.

1. As will be described later on, a lattice constant of a crystal structure on a certain particular crystal face is close to that of a GaN hexagonal crystal.

2. The thermal expansion coefficient ($10 \times 10^{-6}$/°C.) is close to a thermal expansion coefficient ($5.6 \times 10^{-6}$/°C.) of the GaN hexagonal crystal.

3. As will be described later on, a crystal structure on a particular crystal face is similar to that of the GaN hexagonal crystal.

4. The melting point is such a high temperature as 1875° C. and a phase transition is not observed at a temperature below the melting point.

What is particularly important here is that the YAlO$_3$ crystal has the crystal structure and the lattice matching property described in the above items 1 and 3.

Initially, investigation will be made on a case where the semiconductor laminating structure according to the present invention is formed on the (111) face of the YAlO$_3$ crystal.

[1] Investigation on Crystal Growth on the (111) Face of the YAlO$_3$ Crystal

Figure 5:
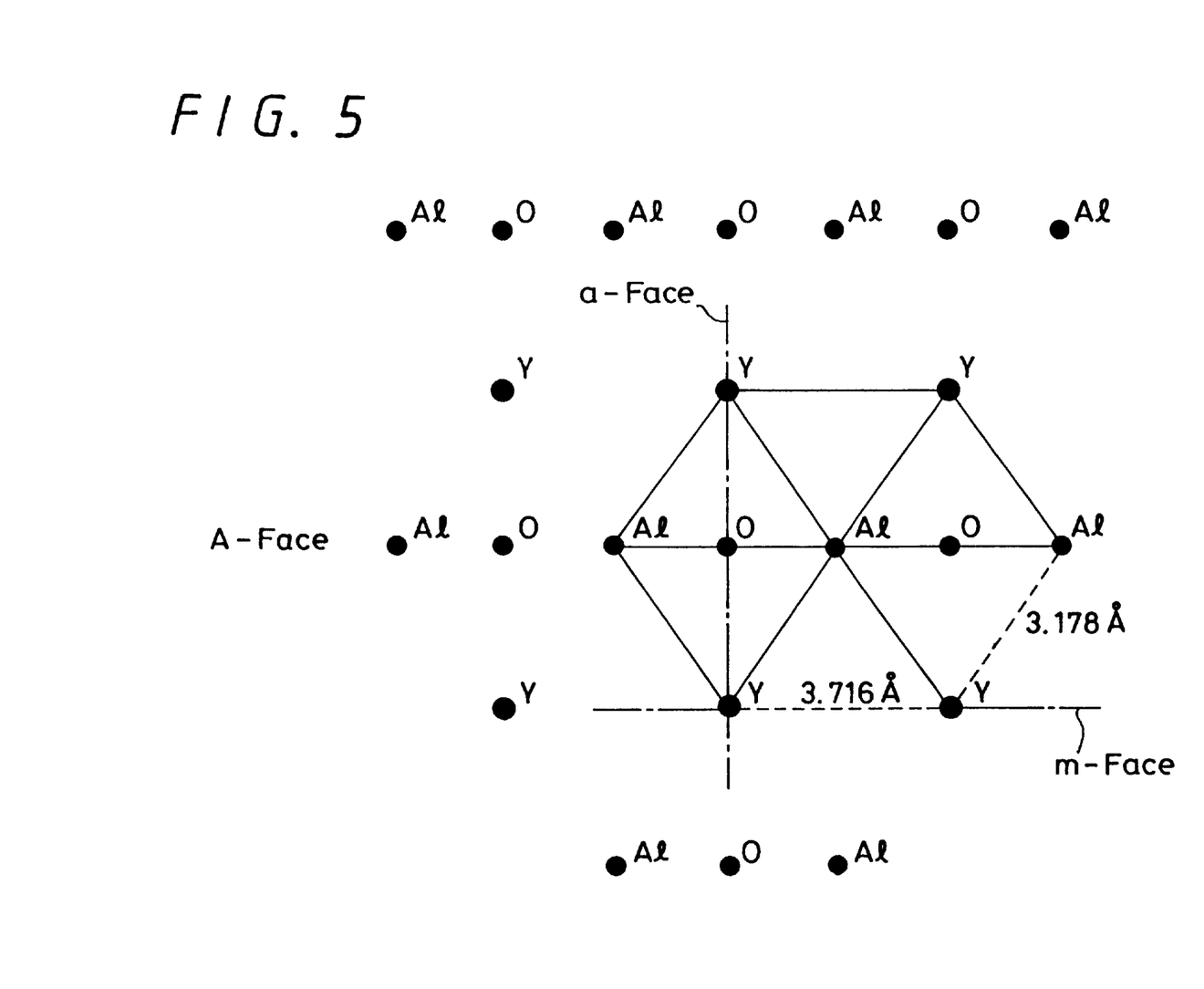
FIG. 5 is a diagram showing an array of atoms on an A-face of a (111) face of the $YAlO_3$ crystal.
Figure 6:
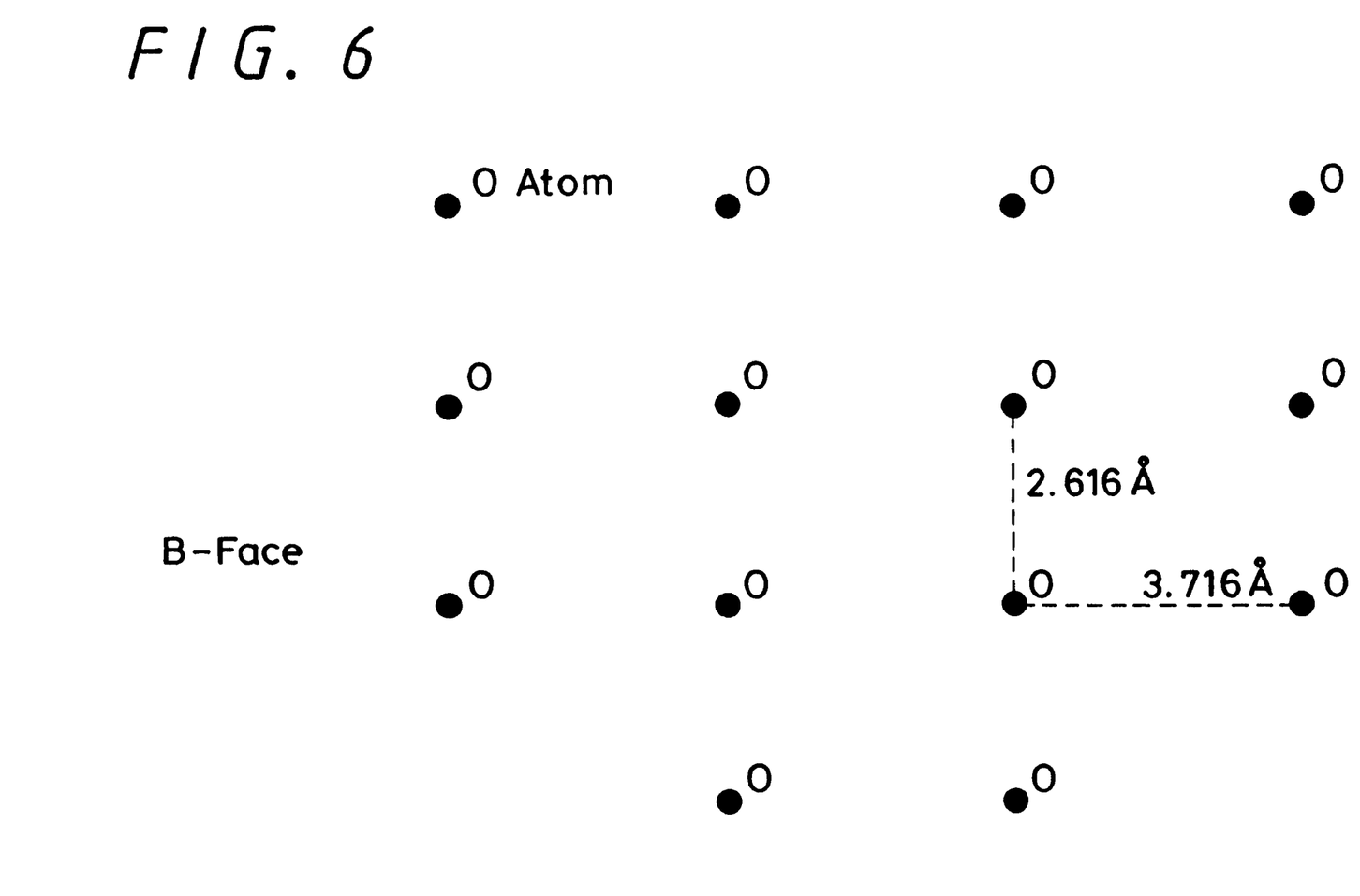
FIG. 6 is a diagram showing an array of atoms on a B-face of a (111) face of the $YAlO_3$ crystal.

Analysis on the crystal structure using a computer revealed that the crystal on the (111) face has faces as shown in FIG. 5 and FIG. 6. The analysis on the crystal structure was performed based on a space group and reported lattice constants of the crystal, and distortion of the crystal is not taken into consideration.

That is, it was found that the crystal on the (111) face consists of lamination of three kinds of faces, i.e., an A-face in which, as shown in FIG. 5, respective atoms of Y, Al and O are present in an intermingled fashion, a B-face in which, as shown in FIG. 6, only O atoms are present, and an A'-face in which Y atoms, Al atoms and O atoms on the A face are translated so that the Y atoms overlap on the most adjacent O atoms, in the order of ABA'BABA'BA . . .

The A-face will be examined in detail. As shown in FIG. 5, the Y atoms and Al atoms on the A-face form a hexagonal shape distorted in the longitudinal direction in FIG. 5. Estimation on lengths of sides of the hexagonal shape resulted in, as are noted in FIG. 5, $a_1$=3.178 Å and $a_2$=3.716 Å.

On the other hand, Ga atoms (or N atoms) form a hexagonal shape on a (0001) face of the GaN hexagonal crystal. Each of the sides of this hexagonal shape has the same length, a, i.e., a=3.189 Å.

Comparison between the YAlO$_3$ crystal and GaN crystal reveals that they have the same hexagonal shape and their side lengths are similar to each other. If the Y atoms and Al atoms of the YAlO$_3$ crystal forming the hexagonal shape on the (111) A face are combined with Ga atoms or N atoms of the GaN crystal on the (0001) face, then a size of the lattice mismatch $\Delta a$ between the YAlO$_3$ crystal and the GaN crystal is defined as follows:

$$\Delta a = [a\,(GaN) - a\,(substrate)]/a\,(substrate)$$

(where a (GaN) is a lattice constant of the GaN crystal and a (substrate) is a lattice constant of the substrate).

Calculation based on the above equation resulted in the following values:

$\Delta a = +0.3\%$ for a lattice constant $a_1$ on the (111) YAlO$_3$ face.

$\Delta a = -14.2\%$ for a lattice constant $a_2$ on the (111) YAlO$_3$ face.

The above values of lattice mismatch derive from the following equation (1) which defines the lattice mismatch $\Delta a$:

This lattice mismatch is smaller than the above-described mismatch between the GaN crystal and the sapphire substrate, i.e., 16.1%. Particularly, the lattice mismatch $\Delta a$ for the lattice constant $a_1$ on the (111) face of the YAlO$_3$ crystal exhibits considerably small value.

Figure 7:
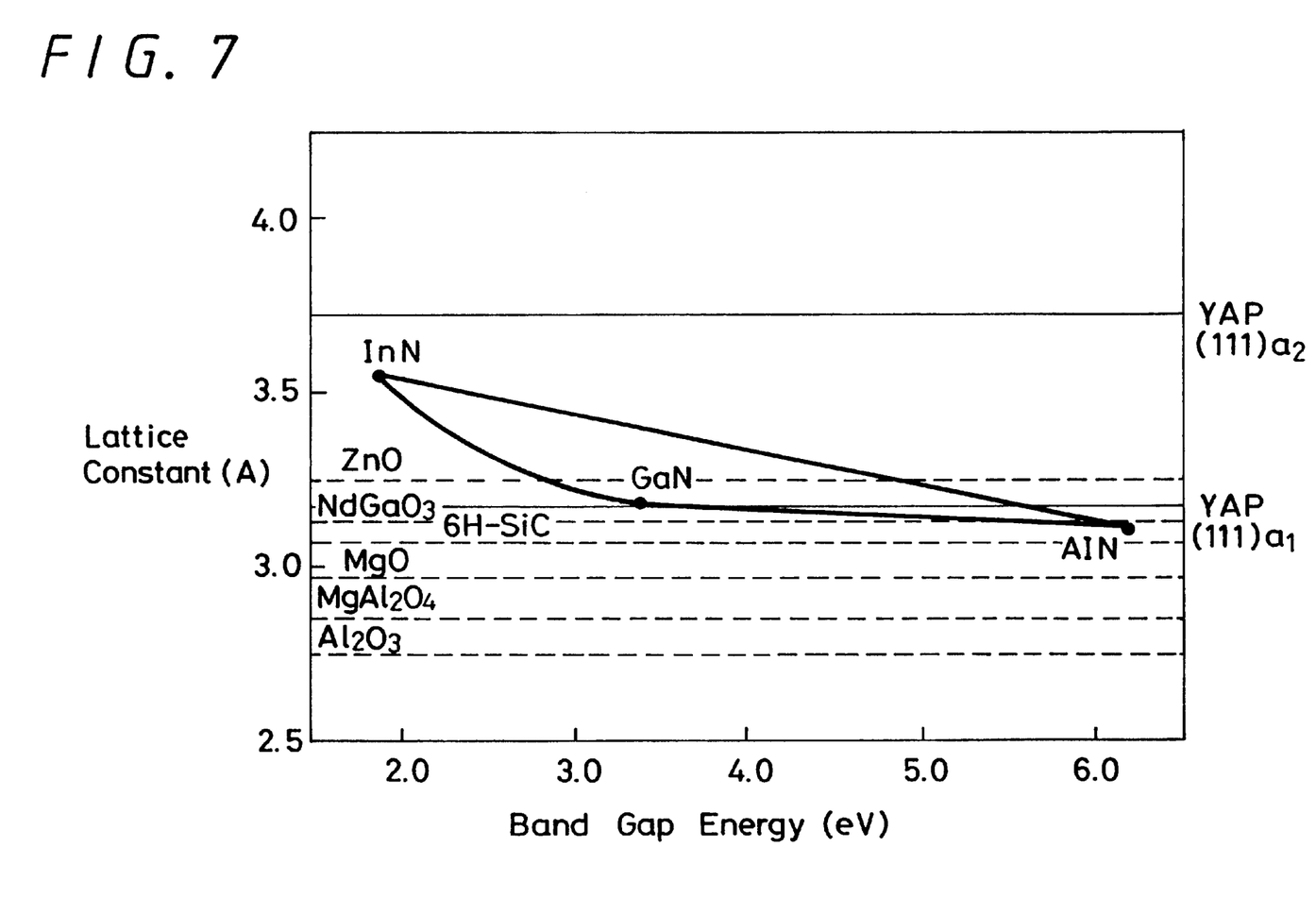
FIG. 7 is a diagram showing a band gap energy and a lattice constant of each material.

Further, the lattice mismatch $\Delta a$ for the above lattice constant $a_1$ is the closest to the lattice constant of the GaN crystal among lattice constants of various conventional crystal growing substrates, as will be understood from FIG. 7 to which reference can be made for comparing the lattice constants of the various conventional crystal growing substrates with the lattice constant of the GaN crystal.

Therefore, the whole energy yielding from the lattice mismatch between the YAlO$_3$ crystal of the (111) face and the GaN hexagonal crystal of the (0001) face comes lower than that of combination between the aforesaid sapphire substrate and the GaN crystal. Accordingly, it is understood that defect density caused by the energy resulting from the lattice mismatch can be lowered.

Actually, a GaN crystal layer was grown on the (111) face of the YAlO$_3$ crystal substrate by an MBE (Molecular Beam Epitaxy) method. Observation with an RHEED (reflective high energy electron diffraction apparatus) revealed that a streak-like pattern was generated, no twin crystal was found and a two-dimensional growth was confirmed. Further, it was confirmed that a crystal growing surface in this case was a mirror surface. In addition, a pitch of the streak determined by a RHEED pattern substantially coincided with the pitch of the streak pattern of the GaN crystal grown on the sapphire substrate. Therefore, it was confirmed that a hexagonal GaN single crystal was grown forming a (0001) face. Accordingly, as will be understood from the above crystal structure analysis, the crystal structure on the (0001) face of the GaN crystal is quite similar to that on the (111) face of the $YAlO_3$ crystal, and hence it is understood that a GaN crystal can be formed on the $YAlO_3$ crystal substrate with relatively good lattice matching.

Figure 8:
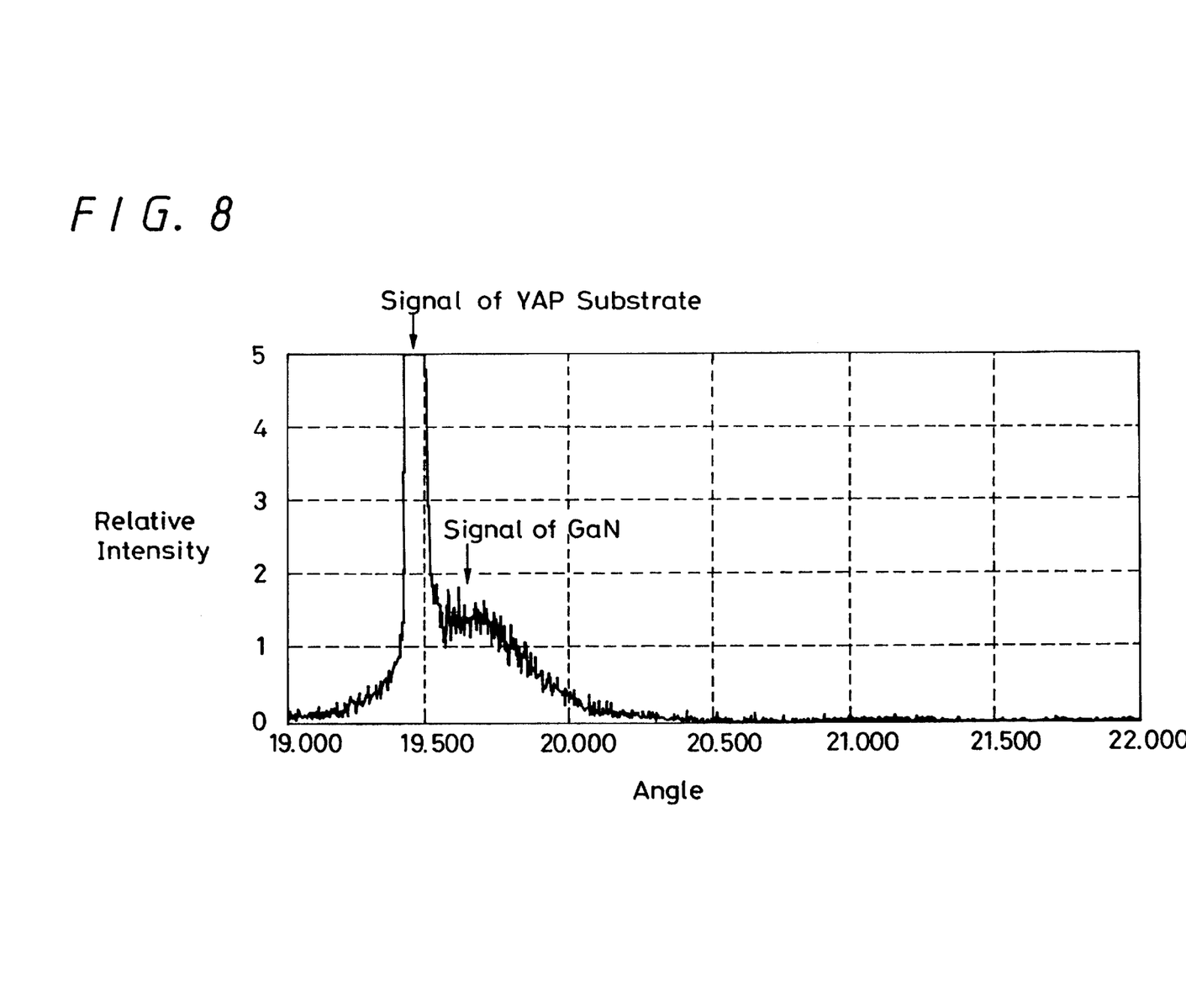
FIG. 8 is a diagram showing an X-ray reflection spectrum of a GaN crystal which is grown on a (111) face of the $YAlO_3$ crystal.
Figure 9:
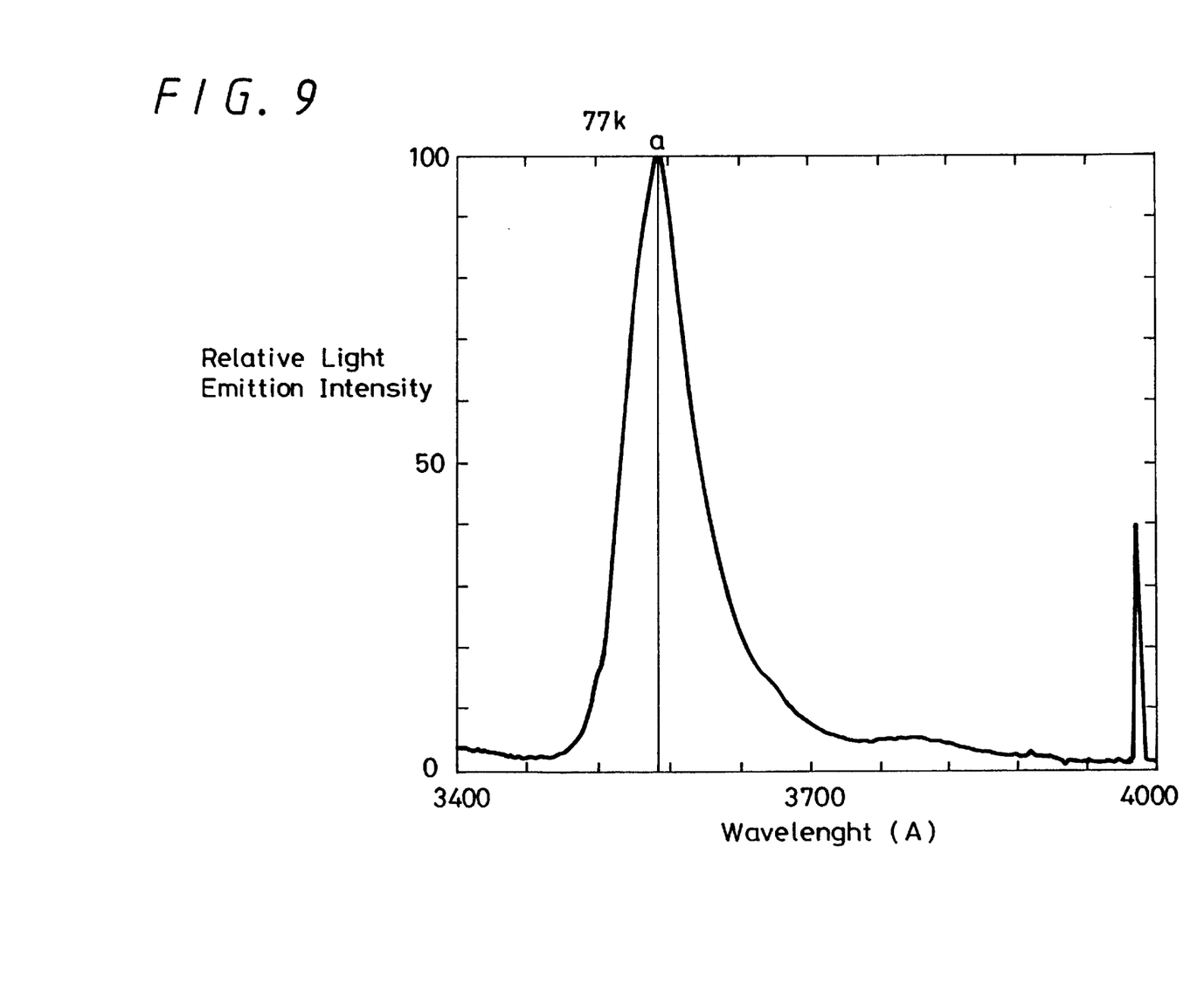
FIG. 9 is a diagram showing a PL spectrum of GaN which is grown on the (111) face of the $YAlO_3$ crystal substrate.

Further, in order to determine crystal property of the GaN crystal, GaN was grown on the (111) face of the above-described $YAlO_3$ substrate and its X-ray reflection spectrum and PL (photoluminescence) spectrum were measured. FIG. 8 and FIG. 9 show the x-ray reflection spectrum and the PL spectrum, respectively. From these figures, it can be studied that these spectrums had relatively narrow in a half-width and the GaN crystal has a satisfactory crystal property. Particularly, a band-edge emission was predominant in the PL spectrum, similarly to the case of the GaN crystal on the sapphire substrate, and its light emission intensity from a deep level was weak. Moreover, it was confirmed that the half-width thereof was narrower than that of the GaN crystal on the sapphire substrate. Thus, it was confirmed that a GaN crystal can be grown on the $YAlO_3$ substrate with a high quality.

The GaN crystal was grown on the (111) face of the YAlO3 crystal by the MBE method. In this case, the $YAlO_3$ substrate having the (111) face is bonded on a support block made of Mo through In, and the substrate supported by the block was placed in an MBE growing chamber. Then, the substrate was kept at a temperature of 300° C. for about five minutes to remove water contained in the substrate and the Mo block. Thereafter, nitrogen gas was introduced into the growing chamber. The nitrogen gas was introduced at a rate of 2 cc/min and a degree of vacuum in the growing chamber reached $1 \times 10^{-4}$ Torr. Here, ECR (Electron Cyclotron Resonance) plasma generating apparatus was driven to make nitrogen (N) into plasma. The energy of microwave supplied for generating plasma was about 40 W. The nitrogen plasma was irradiated onto the $YAlO_3$ substrate to raise the temperature of the substrate up to 850° C. The nitrogen plasma was irradiated for about 30 minutes. Thereafter, a shutter of a Ga cell as a molecular beam source, which had been raised in its temperature in advance, was opened to apply a Ga beam and the nitrogen plasma to the $YAlO_3$ substrate at a time to thereby effect epitaxial growth of the GaN crystal. The Ga beam at this time was $1.5 \times 10^{-7}$ Torr.

Next, crystal growth on the (110) face and (001) face of the $YAlO_3$ crystal will be described.

[2] Investigation on Crystal Growth on the (110) Face of the $YAlO_3$ Crystal

Figure 10:
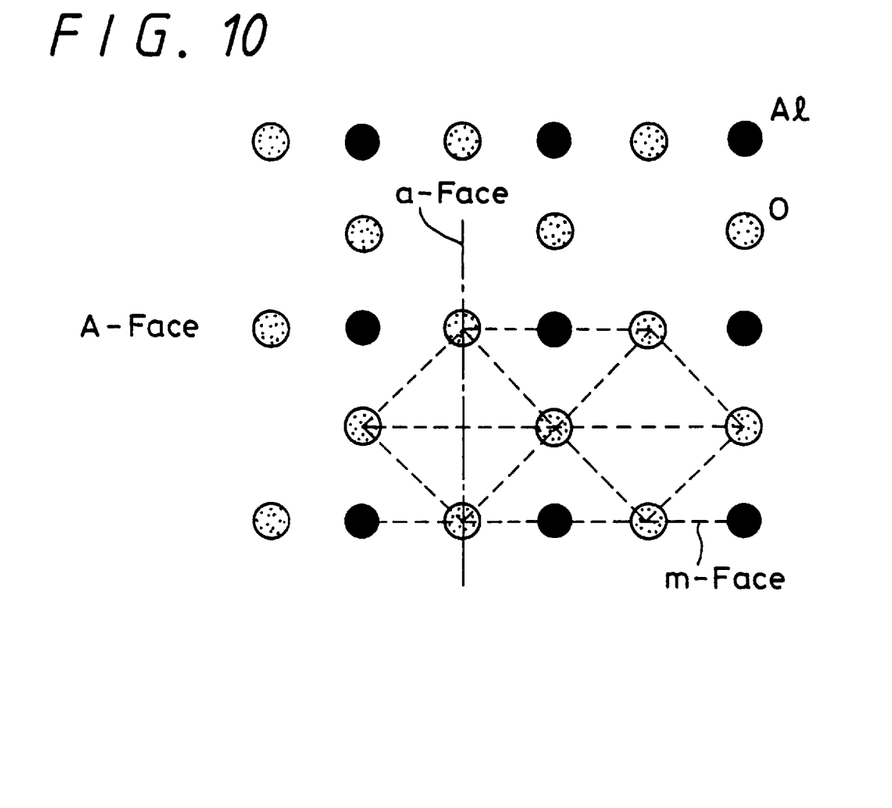
FIG. 10 is a diagram showing an array of atoms on the A-face of a (110) face of the YAlO$_3$ crystal.
Figure 11:
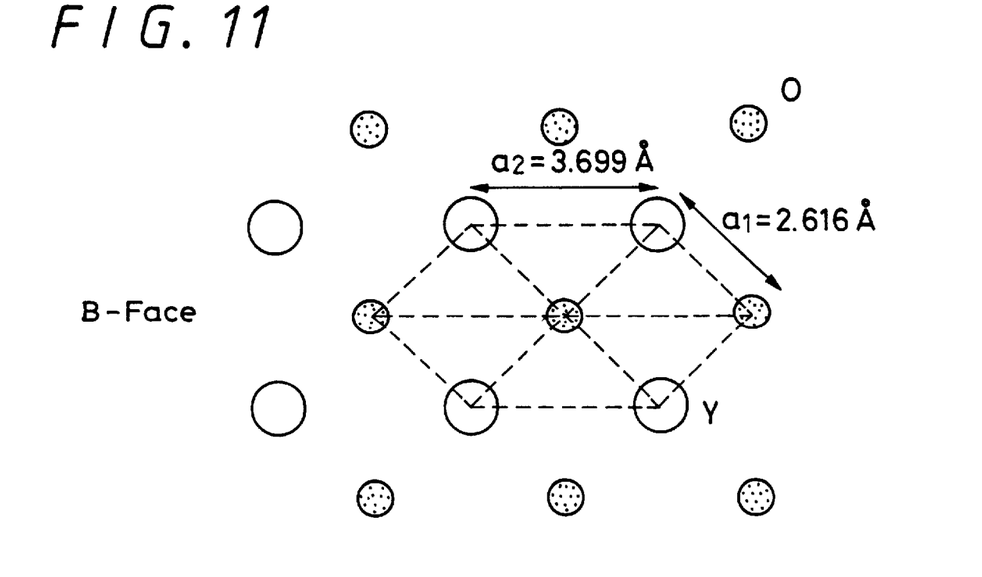
FIG. 11 is a diagram showing an array of atoms on the B-face of the (110) face of the YAlO$_3$ crystal.

Analysis on the crystal structure using a computer revealed that the crystal of a (110) face was formed to have faces as shown in FIG. 10 and FIG. 11. That is, there was formed a lamination of two kinds of faces, i.e., an A-face in which Al atoms and O atoms are present in an intermingled fashion and a B-face in which Y atoms and O atoms are present in an intermingled fashion in the order of ABABA . . . Investigation on the B-face revealed that the Y atoms and O atoms form a hexagonal shape. This hexagonal shape also is distorted in its longitudinal direction in FIG. 10 and FIG. 11. Estimation on the sides of the hexagonal shape resulted in the following numerical values, as are noted in FIG. 11.

$a_1$=2.616 Å
$a_2$=3.699 Å

Calculation on the size of the lattice mismatch between the (110) $YAlO_3$ face and the (0001) GaN face resulted in the following numerical values based on the above-described equation defining the size of the lattice mismatch Δa.

Δa=+21.9% for the lattice constant $a_1$ of the (110) $YAlO_3$ face.

Δa=−13.8% for the lattice constant $a_2$ of the (110) $YAlO_3$ face.

The directions of the lattice mismatchings of the above lattice constants are opposite to each other and their degrees are substantially the same. Therefore, if reference is made to the fact that the size of the lattice mismatch of the GaN on the sapphire substrate is isotropic and Δa=16.1%, a possibility is suggested that distortions of the $YAlO_3$ substrate and the GaN crystal face can be relieved.

Then, a GaN crystal was grown on the (110) face of the $YAlO_3$ crystal substrate by the MBE method in a manner similar to the above-described manner that was employed for epitaxially growing the GaN crystal on the (111) face of the $YAlO_3$ crystal substrate. Visual observation revealed that a mirror surface was grown and inspection with its RHEED revealed that a streak-like pattern was generated. Though the streak was observed on the (0001) GaN face, a pitch of the streak was one kind. Therefore, it was understood that the GaN crystal was grown forming the (0001) face with no twin crystal in an epitaxial fashion. However, since a spot was observed within the streak, it was understood that the crystal growth was achieved in a three-dimensional fashion with some unevenness rather than in a two-dimensional fashion with flatness. Accordingly, it is difficult to achieve a crystal property of high quality such as of the GaN crystal grown on the above-described (111) $YAlO_3$ face, but it was understood that a GaN crystal can be grown forming the (0001) face on the (110) $YAlO_3$ face in an epitaxial fashion.

[3] Investigation on Crystal Growth on the (001) Face of the $YAlO_3$ Crystal

Figure 12:
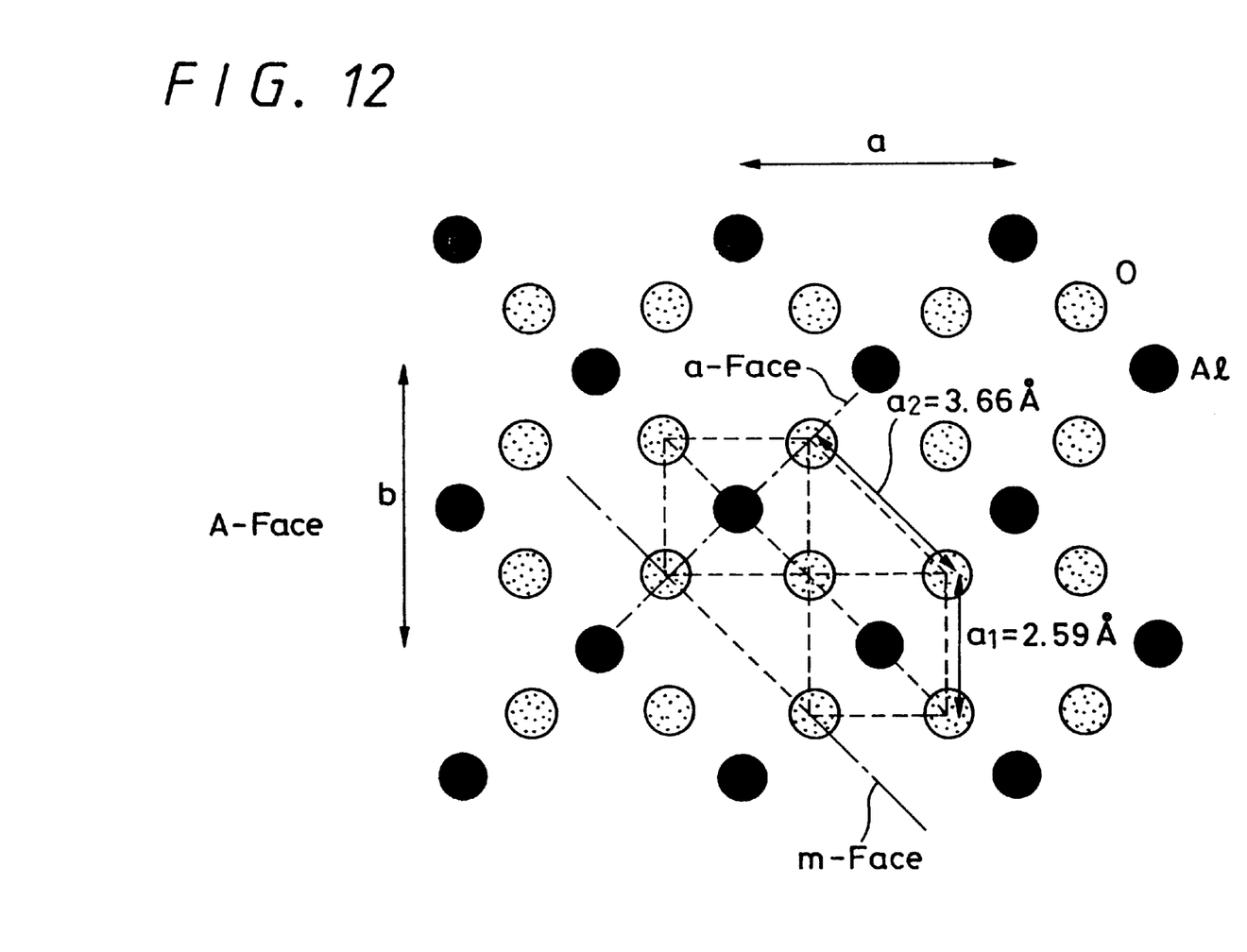
FIG. 12 is a diagram showing an array of atoms on the A-face of a (001) face of the YAlO$_3$ crystal.
Figure 13:
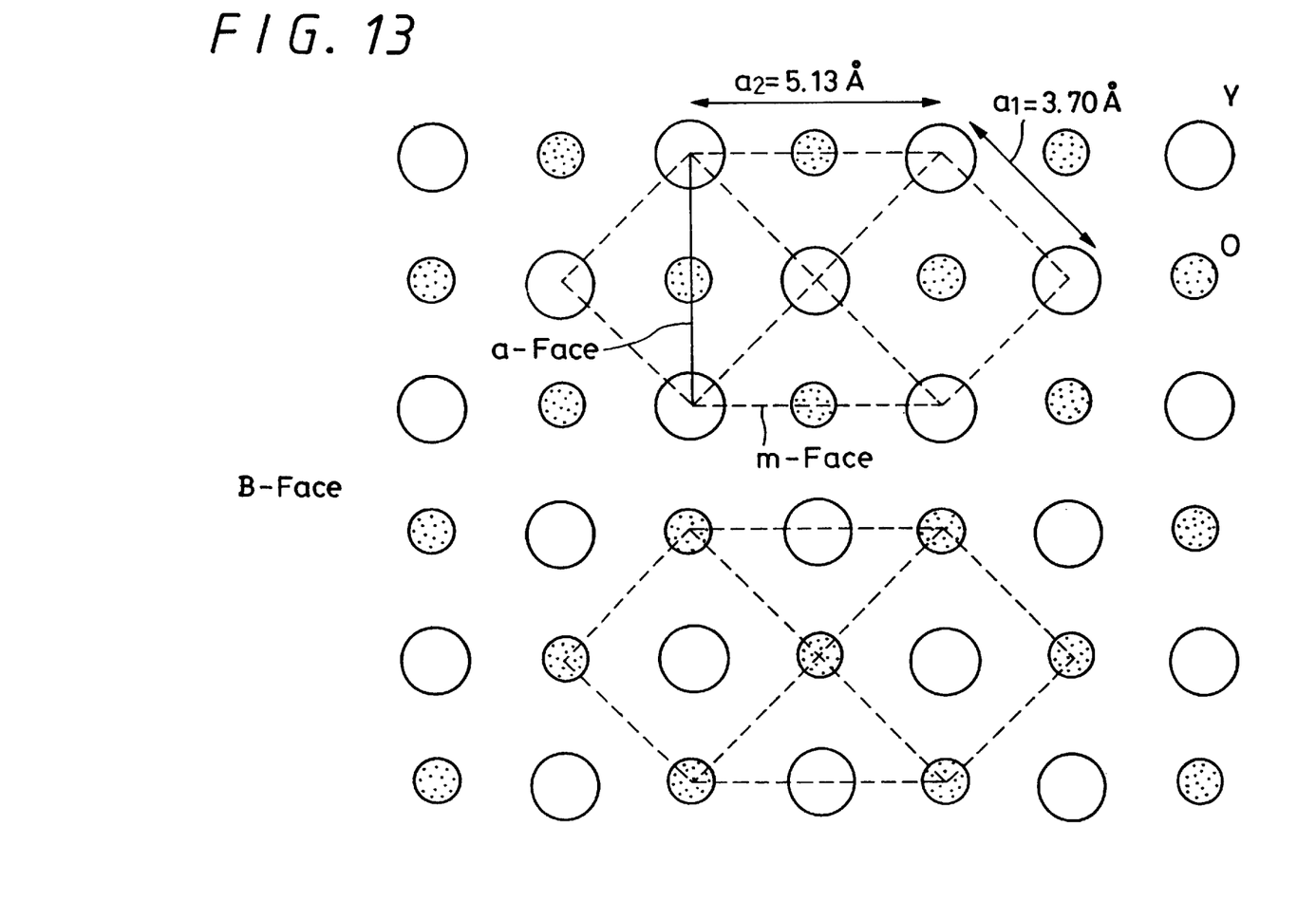
FIG. 13 is a diagram showing an array of atoms on the B-face of the (001) face of the YAlO$_3$ crystal.

Analysis on the crystal structure using a computer revealed that the crystal of a (001) face was formed to have faces as shown in FIG. 12 and FIG. 13. That is, there was formed a lamination of two kinds of faces, i.e., an A-face in which Al atoms and O atoms were present in an intermingled fashion and a B-face in which Y atoms and O atoms were present in the intermingled fashion in an order of ABABA . . . Investigation on the A-face revealed that the O atoms form a hexagonal shape. This hexagonal shape also is distorted as shown in FIGS. 12 and 13. Estimation on the sides of the hexagonal shape resulted in the following numerical values, as are noted in FIG. 12.

$a_1$=2.59 Å
$a_2$=3.66 Å

Calculation on the size of the lattice mismatch between the (001) $YAlO_3$ face and the (0001) GaN face, resulted in the following numerical values by using the aforesaid defining equation.

Δa=+23.1% for a lattice constant $a_1$ of the (001) $YAlO_3$ face.

Δa=−12.9% for a lattice constant $a_2$ of the (001) $YAlO_3$ face.

The directions of the respective lattice mismatchings are opposite to each other similarly to the aforesaid case in which the GaN crystal was formed on the (110) $YAlO_3$ face. Therefore, the distortion of the GaN crystal face is relieved and hence, as will be described later on, a possibility is suggested that, the GaN crystal can be grown forming the (0001) face on the (001) YAlO$_3$ face in an epitaxial fashion.

Then, a GaN crystal was grown on the (001) face of the YAlO$_3$ crystal substrate by the MBE method in a manner similar to the above-described manner that was employed for growing the GaN crystal on the (111) YAlO$_3$ face. Visual observation revealed that a mirror surface was grown and inspection with its RHEED revealed that a streak-like pattern was generated. Since a streak pitch was observed on the (0001) GaN face, it was understood that the GaN crystal was grown forming the (0001) face in an epitaxial fashion. However, since a spot was observed within a streak, it was understood that the crystal growth was achieved in a three-dimensional fashion with some unevenness rather than in a two-dimensional fashion with flatness, and a twin crystal was present. Accordingly, it is difficult to achieve a crystal property of high quality that was achieved when the GaN crystal is grown on the above-described (111) YAlO$_3$ face or the (110) YAlO$_3$ face. However, a possibility is suggested that the GaN crystal can also be grown forming the (0001) face on the (001) YAlO$_3$ face in an epitaxial fashion.

The semiconductor laminating structure having an arrangement in which a semiconductor layer made of a GaN system chemical compound is formed on the (111) face of the YAlO$_3$ substrate, the (110) face of the YAlO$_3$ substrate or the (001) face of the YAlO$_3$ substrate, has a cleavage property because the semiconductor laminating structure has no rotation within the substrate surface in the crystal azimuth like a GaN crystal formed on the sapphire substrate. If the semiconductor laminating structure is to be split at a cleavage face, it is preferable to select the cleavage face from an m-face or an a-face of the GaN crystal.

FIGS. 5, 10, 12 and 13 show positional relationships between the m-face and the a-face of the GaN crystal formed on the substrate and the respective faces of the substrate.

According to the present invention, the semiconductor laminating structure is arranged by forming the semiconductor layer made of a GaN system chemical compound on the (111) face of the YAlO$_3$ crystal substrate.

An example in which the present invention is applied to a semiconductor light emitting deice, e.g., a semiconductor laser made of a GaN system III–V family chemical compound, will be described with reference to FIG. 1 wherein a schematic cross-sectional view of the semiconductor laminating structure is shown.

In the present example, a buffer layer 2 made of GaN, AlN or AlGa is grown in an epitaxial fashion on a YAlO$_3$ crystal substrate 1, preferably on a (111) face of the YAlO$_3$ substrate, depending on necessity by an MBE method or MOCVD (Metal Organic Chemical vapor Deposition) method. Successively, or continuously, a first cladding layer 3 made of Al$_{0.15}$Ga$_{0.85}$N with a first conductivity type, e.g., an n-type, an active layer 4 made of GaN, a second cladding layer 5 made of Al$_{0.15}$Ga$_{0.85}$N with a second conductivity type, e.g., an p-type, and a contact layer 6 made of GaN having the same conductivity type, i.e., the p-type, are grown in an epitaxial fashion.

Thereafter, an annealing is carried out for activating carriers contained in the second cladding layer 5 and the contact layer 6.

Then, an etching process is effected by using an RIE (reactive ion etching) with a photolithography, for example, from the side of the contact layer 6 to a depth reaching the first cladding layer 3, whereby a part of the cladding layer 3 is exposed to the outside. One of electrodes made of, for example, Ti and Al, is laminated as a layer on the surface of the exposed first cladding layer 3 and alloy processing is effected so that an n-side electrode 7 is formed on the cladding layer 3 in an ohmic contact therewith.

An insulation film 8 is formed on the contact layer 6. Then, an etching is effected to the insulation film 8 by means of photolithography, for example, to make an aperture 8W in a stripe shape which extends in a direction perpendicular to the sheet of paper of FIG. 1. A laminated layer of Ni and Au, for example, is deposited on the contact layer 6 through the aperture portion 8W and an alloy processing is effected on the laminated layer to form a p-side electrode 9 in an ohmic contact with the contact layer 6.

The GaN system semiconductor light emitting device having an arrangement of the semiconductor laminating structure, which is formed of the GaN system chemical compound, is excellent in its crystalline property. Thus, there was provided a semiconductor light emitting device which has a stability and a high reliability and is excellent in light emission characteristic.

Figure 1:
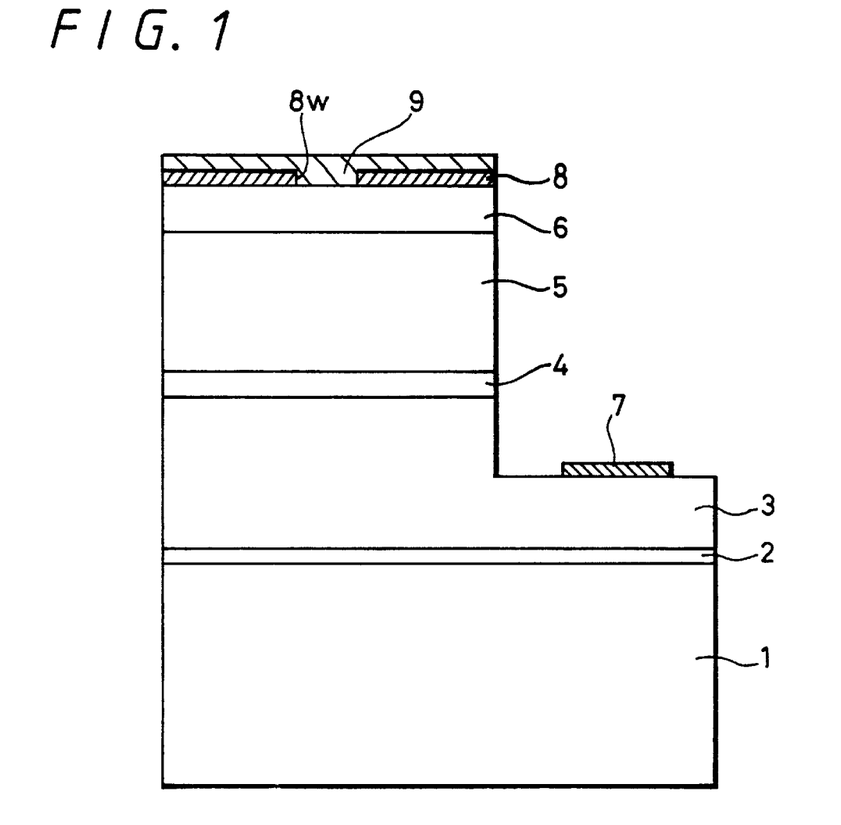
FIG. 1 is a schematic cross-sectional view of one example of a semiconductor light emitting device to which the present invention is applied.

In the arrangement shown in FIG. 1, etching is effected for exposing the cladding layer 3 and then the electrode 7 is formed on the exposed portion of the cladding layer 3. However, the YAlO3 crystal substrate 1 may be doped with an impurity to provide the electrode 7 on the side of the substrate 1. In this case, the semiconductor light emitting device can be easily manufactured.

Further, the present invention can be applied to other GaN system semiconductor devices. An example in which the present invention is applied to an MESFET (Metal Semiconductor Field Effect Transistor) will be described with reference to FIG. 2 which is a schematic plan view of the device and FIG. 3 which is a schematic cross-sectional view of the same.

Figure 2:
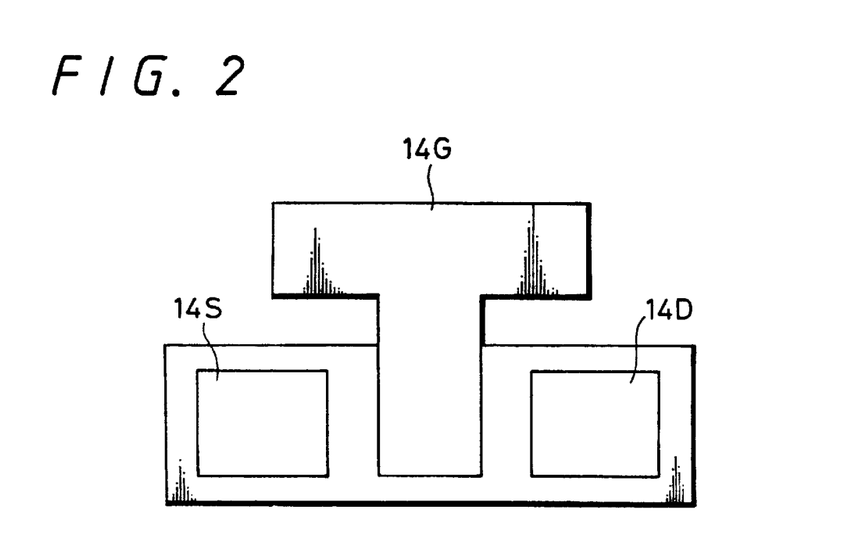
FIG. 2 is a schematic plan view of an MESFET to which the present invention is applied.
Figure 3:
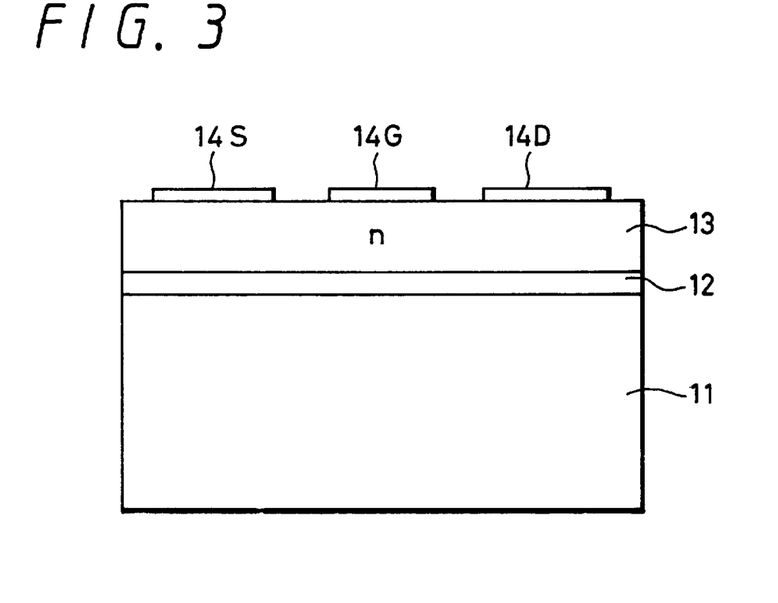
FIG. 3 is a schematic cross-sectional view of the MESFET shown in FIG. 2.

Also in this case, a buffer layer 12 made of GaN or AlN is epitaxially grown on the (111) face of an YAlO$_3$ crystal substrate 11 depending on necessity by the MBE method or the MOCVD method. Subsequently, or continuously, a semiconductor layer 13 made of GaN with a first conductivity type, e.g., the n-type is grown on the buffer layer 12 in an epitaxial fashion to be used for forming a channel. If a plurality of MESFETs or other circuit elements, for example, are formed on the same semiconductor layer 13, although not shown, a separation groove may be formed by the RIE, or alternatively, an element separation region may be formed by ion injection or the like, for example, at a portion between elements that should be electrically separated from each other.

Then, an ohmic electrode 14S and an ohmic electrode 14D for a source and a drain are vapor deposited on the semiconductor layer 13 with an interval therebetween. At this time, an electrode pattern is formed by effecting an etching with the photolithography or the like. Thereafter, an alloy processing is effected on the electrodes to reduce the contact resistance.

A Schottky gate electrode 14G is formed between the source electrode 14S and the drain electrode 14D.

According to the semiconductor structure with the semiconductor device such as the MESFET or the like formed as the layers on the YAlO$_3$ crystal substrate 11 in this manner, the semiconductor layer comes to have an excellent crystalline property. Therefore, it is possible to improve life of minority carriers, mobility of carriers, the conductance Gm, and suppress scattering of the threshold voltage value and so on.

While in the above-described example the present invention is applied to the semiconductor light emitting device and the MESFET, it is needless to say that the present invention can be applied to other various semiconductor devices. Also it is needless to say that the semiconductor light emitting device and the MESFET are not limited to have the above structure but can take various constructions.

In the present specification, each of the crystal faces of (111), (110), (001) includes a face tilted from each crystal face within a range that keeps substantially the same characteristic of the crystal face.

As described above, according to the semiconductor laminating structure of the present invention, a semiconductor of a GaN system chemical compound is laminated on the YAlO$_3$ crystal substrate epitaxially. Therefore, various semiconductor devices formed according to the structure come to have little dislocation density due to the lattice mismatching between the substrate and the GaN semiconductor layer, and hence each of the semiconductor devices has excellent characteristics.

If the present invention is applied to a semiconductor light emitting device, i.e., a semiconductor laser, it is expected to reduce a non-radiative center, thereby reducing the threshold current value $I_{th}$. Further, the life of the laser can be elongated.

The YAlO$_3$ crystal substrate may be doped with an impurity to lead one electrode from the side of the YAlO$_3$ crystal substrate in a semiconductor laser, for example. Therefore, this kind of semiconductor device can be manufactured with ease.

Further, since the semiconductor layer arranged according to the present invention has an excellent crystalline property, when the present invention is applied to the semiconductor device such as the MESFET or the like, it is possible to improve the life of minority carriers, mobility of the carriers and the conductance Gm, and to suppress scattering of the threshold voltage value and so on.

Having described a preferred embodiment of the invention with reference to the accompanying drawings, it is to be understood that the invention is not limited to that precise embodiment and that various changes and modifications could be effected therein by one skilled in the art without departing from the spirit or scope of the invention as defined in the appended claims.

What is claimed is:

1. A semiconductor laminate structure comprising:
   a substrate having a perovskite structure made of YAlO$_3$ wherein a major surface of the substrate has a crystal face of (111), and at least one semiconductor layer comprised of a chemical compound including N and at least one other chemical selected from the group consisting of Al, B, Ga, or In formed over the substrate, wherein a lattice length of the chemical compound is substantially a whole number multiple of a lattice length of the substrate.

2. The semiconductor laminate structure according to claim 1, wherein said chemical compound has a hexagonal crystal structure.

3. A semiconductor light emitting device comprising:
   a substrate comprised of yttrium, aluminum perovskite and at least one semiconductor layer comprised of a chemical compound including N and at lest one chemical selected from the group consisting of: Al, B, Ga, or In formed on said substrate wherein a major surface of said substrate has a crystal face of (111), and wherein a lattice length of the chemical compound is substantially a whole number multiple of a lattice length of the substrate.

4. A field-effect transistor comprising:
   a substrate comprised of yttrium, aluminum perovskite, and at least one semiconductor layer comprised of a chemical compound containing N and at least one chemical selected from the group consisting of Al, B, Ga and In formed on said substrate wherein a major surface of said substrate has a crystal face of (111), and wherein a lattice length of the chemical compound is substantially a whole number multiple of a lattice length of the substrate.

5. A semiconductor laminate structure comprising:
   a substrate having a perovskite structure made of YAlO$_3$ wherein a major surface of the substrate has a crystal face of (001), and at least one semiconductor layer comprised of a chemical compound including N and at least one chemical selected from the group consisting of Al, B, Ga or In formed on said substrate wherein a lattice length of the chemical compound is substantially a whole number multiple of a lattice length of the substrate.

6. A semiconductor laminate structure according to claim 5, wherein said chemical compound has a hexagonal crystal structure.

* * * * *